United States Patent [19]

Wise et al.

[11] Patent Number: 5,036,494

[45] Date of Patent: Jul. 30, 1991

[54] MEMORY ACCESSING

[75] Inventors: Adrian P. Wise; Richard M. Forsyth, both of Bristol, England

[73] Assignee: Inmos Limited, Bristol, England

[21] Appl. No.: 494,681

[22] Filed: Mar. 16, 1990

[30] Foreign Application Priority Data

Mar. 20, 1989 [GB] United Kingdom ................. 8906354

[51] Int. Cl.[5] .......................... G11C 7/00; G11C 8/00

[52] U.S. Cl. ............................... 365/230.03; 365/194; 365/233; 365/203; 365/239

[58] Field of Search ...................... 365/230.03, 230.02, 365/230.09, 189.02, 194, 233, 236, 203

[56] References Cited

U.S. PATENT DOCUMENTS 4,740,923 4/1988 Kaneko et al. ..................... 365/194

4,849,937 7/1989 Yoshimoto ..................... 365/194 X

*Primary Examiner*—Joseph A. Popek
*Attorney, Agent, or Firm*—Edward D. Manzo

[57] ABSTRACT

A line delay device comprises a memory having RAM cells in two blocks, each cell being connected to a pair of bit lines. Memory locations in one block are addressed sequentially and subject to a data transfer while an equate operation is effected on the bit lines of the other block. The operations are switched alternately between the two blocks. In each accessing cycle, a plurality of locations are addressed in selected rows of each block and the switching between each block is effected without addressing all locations in each row addressed so that the accessing cycle ends in a different block from the starting block and each row used has a plurality of addressed locations.

28 Claims, 4 Drawing Sheets

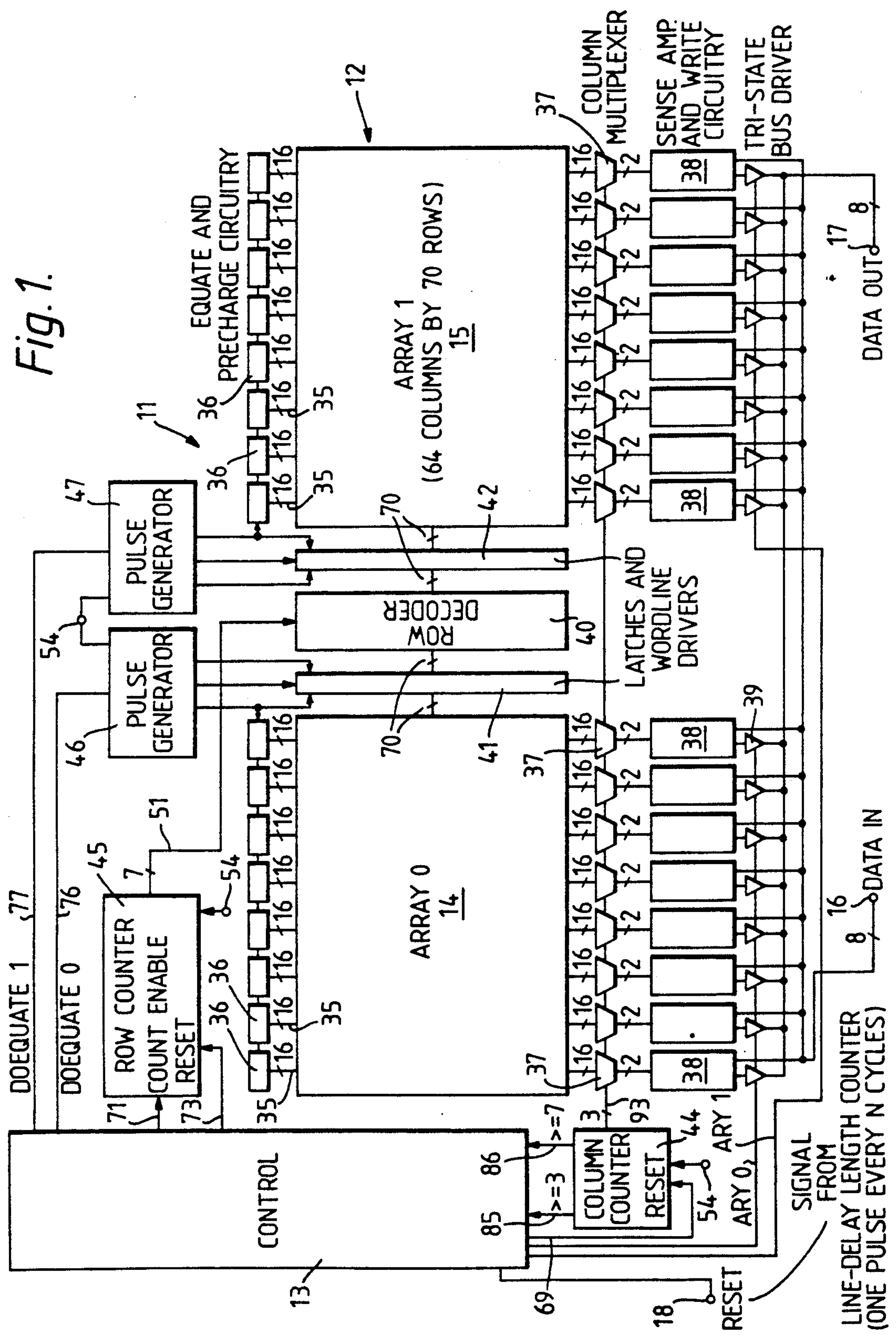
Fig. 1.
EQUATE AND PRECHARGE CIRCUITRY
ARRAY 1 (64 COLUMNS BY 70 ROWS) 15
ARRAY 0 14
COLUMN MULTIPLEXER
SENSE AMP. AND WRITE CIRCUITRY
TRI-STATE BUS DRIVER
DATA OUT
DATA IN
PULSE GENERATOR
ROW DECODER
LATCHES AND WORDLINE DRIVERS
ROW COUNTER COUNT ENABLE RESET
DOEQUATE 1
DOEQUATE 0
CONTROL
COLUMN COUNTER RESET
ARY 1
ARY 0
RESET
SIGNAL FROM LINE-DELAY LENGTH COUNTER (ONE PULSE EVERY N CYCLES)
>=7
>=3

65
53
RESET TO:
0
0
0
0
1
RST
95
96
94
56
52
RESET TO:
0
0
0
1
RST
94
95
96
CLOCK
54
18
RESET
SWAP (4)
SLOW(3)
SLOW(2)
SLOW(1)
SLOW(0)
FAST(3)
FAST(2)
FAST(1)
FAST(0)
60
ARY 0
61
ARY 1
62
ARY 0
63
SWAP(13)
SWAP(9)
SWAP(5)
SWAP (0)
66
67
68
SWAP
69
RESET TO THE COLUMN COUNTER
SWAPCOL
85
ILLEGALCOL
86
70
ARY 0
71
COUNT ENABLE TO ROW COUNTER
64
72
73
RESET TO ROW COUNTER
ILLEGALCOL
86
ARY 1
88
50
COUNT ENABLE
RESET
80
81
ARY 0
ARY 1
82
89
DELAY
90
91
ARY 1
74
76
DOEQUATE 0
75
77
ARY 0
DOEQUATE 1

MEMORY ACCESSING

The invention relates to accessing of memories for holding digital signals and is particularly applicable to memories having a plurality of static RAM cells. The invention is also applicable to the design and operation of line delay circuits, including programmable length line delays, incorporating such memories or using such memory accessing.

BACKGROUND OF THE INVENTION

A line delay comprises a storage device which holds a number of data items making a "line" of data. When, in operation, a data item is transferred to the device another data item is transferred from the device to maintain the number of stored data items. The order in which data is transferred from the device is the same as the order in which it was transferred to the device. The effect is to delay data by one "line".

A programmable length line delay is one in which the length of the line can be decided after the time of manufacture. This includes devices where the length is programmable at the time of use.

Cyclical accessing of memories is known for various purposes. When using memories comprising static RAM cells it is normally necessary to equate bit lines prior to reading data from the cell. It is also normal to equate all the bit lines in order to provide the random access facility. If the memory is accessed once in each clock cycle this requires that equating of the bit lines is effected in each cycle and so the time available for both equating and subsequently transferring the signal to the bit lines is very limited. This can result in high peak power requirements for equating in short time intervals and it further limits the time available for the signal levels to be developed on a bit line pair following connection of a selected cell to a bit line pair.

It is an object of the present invention to provide a memory and method of accessing a memory in which accessing may be carried out to effect a data transfer at each clock cycle while permitting more than one clock cycle for an equating operation for the bit lines.

The invention is applicable to line delay circuits. In previous arrangements using cyclical accessing of memories it has been known to use two pointers one indicating a memory address into which data is to be written and a further pointer to indicate a different memory address from which data is to be read. If the delay is not fixed, then the relationship between the pointers will not be known in advance and so it will be necessary to equate the whole array prior to each read or write operation and additional peak power problems can result from the setting up of two address pointers.

It is an object of the present invention to provide an improved memory system and an improved line delay device in which a single pointer is used for both read and write operations and in which it is not necessary to equate the whole memory array for each transfer of data from the memory array. It is a further object to minimize peak power requirements. This can be particularly important when used with other power consuming circuitry and it allows smaller transistors to be used thereby taking up less chip area. This is particularly important in relation to single chip devices with which the present invention may be used.

SUMMARY OF THE INVENTION

The present invention provides a method of accessing a memory having a plurality of memory locations comprising static RAM cells.

In the method, the memory cells are distributed in at least first and second memory blocks, each block having plural rows and columns, with each cell being connected to a pair of bit lines to transfer data to and from each cell. The method sequentially addressed more than one memory location in the first memory block and works a data transfer for each memory location addressed. Concomitantly, the method effects an equate operation on the bit lines in the second memory block.

After addressing memory locations in the first memory block, the method switches its addressing and equate operations so as to address sequentially more than one memory location in the second memory block. It effects a data transfer for each memory location addressed, while at the same time equates the bit lines in the first memory block.

Preferably each data transfer comprises a data sense operation to read data from the bit lines.

Each data transfer may include a write operation.

Preferably said addressing and equating is time controlled by a clock, each addressing operation and data transfer being effected in one clock cycle and said equating operation having a duration of more than one clock cycle.

Preferably data is transferred from a memory location to a pair of bit lines by a read operation after the lines have been equated and subsequently effecting a sense operation to sense the signal on said pair of bit lines.

Preferably said sense operation forms part of said data transfer and said read operation is effected on selected memory locations during said equate operation in one memory block after the bit lines have been equated and while data transfers are effected in another memory block.

Preferably the equate operation includes precharging the bit lines to drive them to a required voltage level.

Preferably each said addressing operation comprises addressing a plurality of adjacent memory locations in the same row of one memory block.

Preferably one row is addressed in each of said memory blocks, data transfers are effected in selected locations in said row of each memory block in turn while the other is equated, and the row address is changed to select a further row after said one row has been used in each memory block.

Preferably equating bit lines in a memory block comprises equating all bit lines in that memory block.

The method preferably comprises determining a number of data transfers to be effected at a plurality of accessed locations in a memory accessing cycle, sequentially addressing selected memory locations in each of said memory blocks to distribute said accessed locations through each of said memory blocks, said addressing comprising selecting one memory block to start said cycle, addressing a plurality of locations in one row of said block, switching from said one block to another block and addressing a plurality of locations in a row of said another block, said switching from one block to another being effected without addressing all locations in each row addressed in order to end each said cycle in a memory block other than said selected one in which the cycle started and such that any row addressed in either block has a plurality of addressed locations.

Preferably said switching from one block to another is controlled so that any row used in each block has at least half the locations in that row addressed during said memory accessing cycle.

Preferably said memory locations are distributed between two blocks of memory each block having the same number of columns.

The invention includes a method of cyclically accessing a plurality of memory locations in at least two memory blocks each having said memory locations arranged in rows and columns, which method comprises determining a number of memory locations to be addressed in one memory accessing cycle, sequentially addressing selected memory locations in each of said memory blocks to distribute said accessed locations through each of said memory blocks, said addressing comprising selecting one memory block to start said cycle, addressing a plurality of locations in one row of said block, switching from said one block to another block and addressing a plurality of locations in a row of said another block, said switching from one block to another being effected without addressing all locations in each row addressed in order to end said cycle in a memory block other than said selected one in which the cycle started and such that any row used in any memory block has a plurality of addressed locations.

Preferably switching from one block to another is controlled so that any row used in each block has at least half the locations in that row addressed during said memory accessing cycle.

Preferably on switching from addressing one row in said one memory block in which the cycle is started, the same row is addressed in another memory block.

Preferably each memory accessing cycle comprises addressing more than one row in each memory block, at least one row in each memory block being accessed at all memory locations and one row in each memory block being addressed at less than all memory locations in the row.

Preferably data is read from and written into each memory location each time the memory location is accessed.

Preferably said memory locations comprise static RAM cells each connected to a pair of bit lines for use in data transfers to and from the cells, said method further comprising equating bit lines in one memory block while data transfers are effected on a succession of selected memory locations in another memory block.

The invention includes a memory comprising a first memory block, a second memory block, each block having a plurality of rows and columns of memory locations comprising static RAM cells each arranged to hold digital data, a plurality of pairs of bit lines coupled to cells of respective columns for transferring data into and from said cells, column addressing means for addressing said columns, row addressing means for addressing said rows, equating means coupled to said bit lines for equating each pair of bit lines before using each pair of bit lines for transferring data out of a said cell, and control means coupled to said column and row addressing means to address in succession a plurality of memory locations in one of said memory blocks followed by a plurality of memory locations in the other of said memory blocks and to transfer data from said memory locations, said control means being further coupled to said equating means to equate bit lines of each block successively, one block being equated when data is transferred from the other of said blocks.

Preferably said column addressing means and said equating means are coupled to bit lines in both said first and second memory blocks, said control means including switching means to switch both said column addressing means and said equating means between different memory blocks alternately.

Preferably said control means includes address generating means for generating successively a plurality of addresses of adjacent memory locations within the same row of the same memory block and switching means to switch from one memory block to another after addressing a plurality of locations within one memory block.

Preferably the equating means is coupled to all bit lines of a memory block to equate all bit lines of that memory block at the same time.

Preferably said row addressing means is coupled to a plurality of word lines for respective rows and further includes latch means to latch a selected row address for one memory block while a new row address is selected for another memory block.

Preferably writing means is provided to write data into each memory location after each transfer of data, said writing means being coupled to said control means so that data is transferred from and written into each address memory location at each addressing operation.

The memory may include clock means to indicate clock cycles, said addressing means being responsive to said clock means to address a different memory location each clock cycle whereby an equate operation of bit lines in one memory block is effected over a plurality of clock cycles while data is transferred from a succession of locations in another memory block at each of said plurality of clock cycles.

The invention includes a line delay device for use in delaying digital signals by a predetermined number of cycles, said device comprising a memory as aforesaid together with counter means for indicating a number of cycles of delay, and means for cyclically accessing a plurality of locations in said memory dependent on said number of cycles of delay, means being provided to read data from each location and write new data into each location each time the location is accessed.

BRIEF DESCRIPTION OF THE DRAWINGS

FIG. 1 is a block diagram of a line delay circuit including a cyclically addressable memory in accordance with the present invention.

DESCRIPTION OF THE PREFERRED EMBODIMENT

Figure 3:
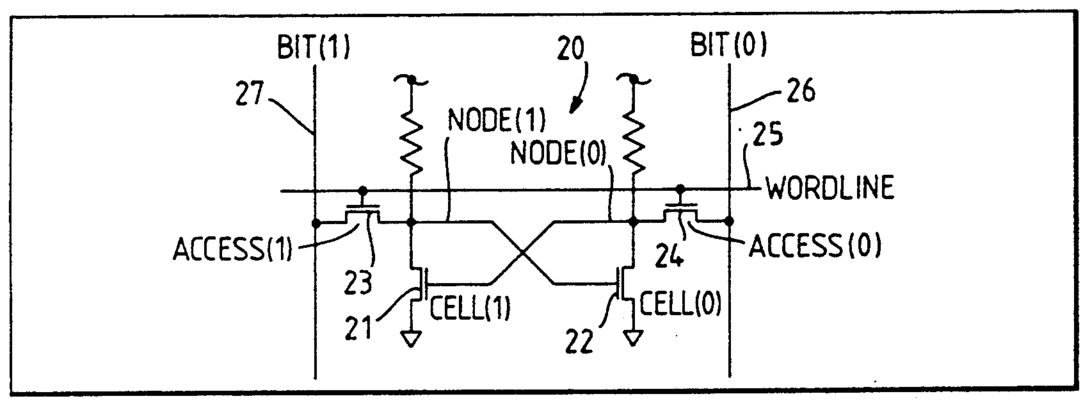
FIG. 3 illustrates a static RAM cell used in the memory of FIG. 1.

The line delay device 11 shown in FIG. 1 comprises a cyclically addressable memory 12 addressable under the control of a row counter 45, a column counter 44 and a control unit 13. The memory 12 is divided into two blocks 14 and 15, the block 14 forming array 0 and block 15 forming array 1. Data is input to the line delay through an input terminal 16 and the delayed output is obtained through an output terminal 17. The extent of delay effected by the line delay device is programmable by the user. A reset signal is input at a terminal 18 the signal being in the form of one pulse every N cycles derived from a delay length counter settable to indicate the number of cycles of delay to be introduced by the line delay circuit. Each memory block 14 and 15 comprises an array of addressable memory locations comprising static RAM cells arranged in rows and columns in known manner. The static RAM cells are of known type and may be for example as shown in FIG. 3 and as described in our U.S. Pat. Nos. 4,471,374 and 4,486,944. In such a memory, each cell 20 comprises two transistors 21 and 22 connected through access transistors 23 and 24 to respective bit lines 26 and 27 forming a bit line pair. The access transistors 23 and 24 have their gates connected to a word line 25. A word line 25 is provided for each row in the array and may be driven high when the respective row of cells is to be addressed. A plurality of bit line pairs 26 and 27 extend in the column direction of the memory array and; are connected similarly to a plurality of memory cells.

In use, during a write operation data is written into each cell 20 by addressing the correct word line 25 and bit lines 26 and 27 and driving the signals on the bit line pair to a level representing the signal to be written into the memory cell. During a read operation data held in the transistors 21 and 22 is read onto the bit line pair 26 and 27 and subsequently sensed for a read-out operation. The construction and operation of such a memory array is described in U.S. Pat. Nos. 4,471,374 and 4,486,944 and that description is included herein by cross-reference.

In use of a cell of the type shown in FIG. 3 it is necessary to equate the bit lines 26 and 27 by precharging the pair of bit lines so that they are driven to the same voltage prior to carrying out a read operation. After equating, one selected word line 25 is driven high so that cells associated with that word line have their transistors 21 and 22 connected to their respective bit line pair 26 and 27. The stored charge in the cell causes the bit line pair to be driven apart so as to provide a voltage difference between the bit line pair thereby providing a small sense margin for detection by sense circuitry connected to the bit lines. Once the voltages on the bit line pair have been sensed, a write operation may be carried out by driving the bit line pair to required signal levels which are then stored in the cell prior to the word line 25 being driven to a low value so as to isolate the cell from the bit line pair.

Figure 6:
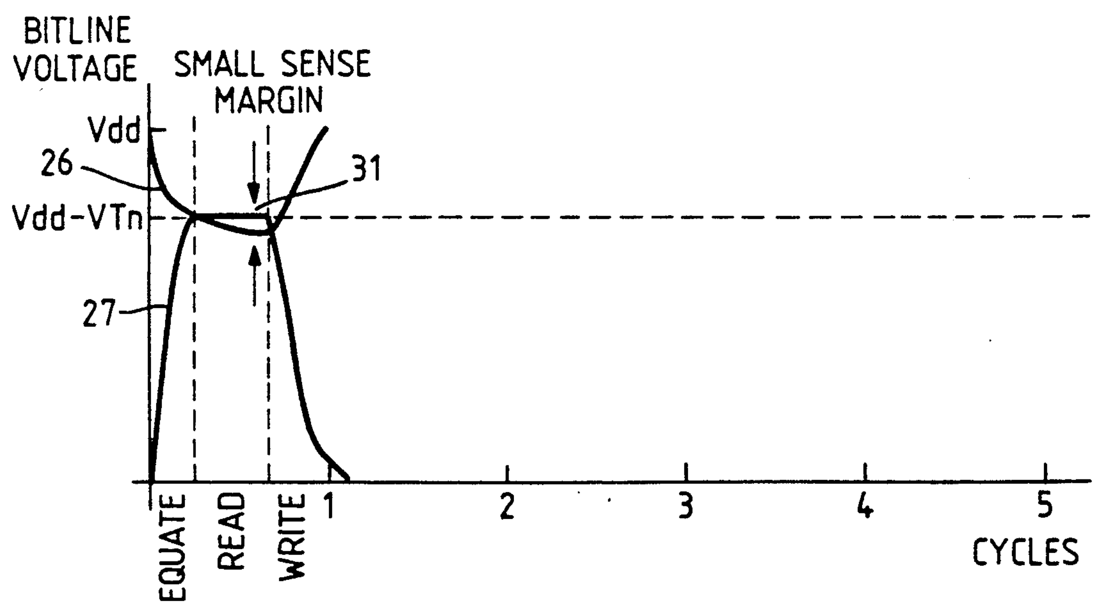
FIG. 6 is a voltage time graph similar to FIG. 5 but showing the operation of a prior art arrangment.

The operation of such a cell in a conventional static RAM memory is shown in FIG. 6. Each accessing of the cell may occur in one clock cycle so that a read and write operation is effected to transfer data from and into the cell during each clock cycle. In this way data is input to and output from the cell or cells at each address per cycle. FIG. 6 illustrates the voltage on a bit line pair 26 and 27 during such a single cycle covering both the equate operation, during which the bit lines are equated, precharged and the cells read, and the write operation. The precharging of the bit lines to equate them has to be effected in a small part of the duration of one cycle thereby requiring a substantial power peak and corresponding transistor size in the equate and precharge circuitry to permit both bit lines to be driven to the same voltage level. The read part of the equate operation must again take place in a small part of the cycle and due to the capacitance of the bit lines relative to the strength of the cell transistors the time available for the read operation only permits a small voltage difference to be induced between the bit line pair ready for sensing by sense circuitry connected to the bit lines. At the end of the read cycle, the voltage difference which has developed is sensed in order to output data from the cell, and the remainder of the cycle is used to carry out a write operation whereby the bit lines are driven apart with corresponding storage of data in the transistors 21 and 22 of the cell.

In a random access arrangement it is necessary to equate the whole memory each cycle.

In accordance with the present example, the memory 12 is split into the two blocks 14 and 15 so that the equating and reading are carried out on memory locations in one of the blocks 14 and 15 while data transfers are effected on a succession of memory locations in the other memory block This allows the equate operation, including reading, to be carried out over a plurality of cycles while the data transfer operations are carried out once in every cycle.

In this particular example, a number of memory locations are cyclically addressed, the number corresponding to the number of clock cycles between successive pulses input at terminal 18 thereby indicating the number of cycles of delay that have been programmed for the line delay. The memory locations in one addressing cycle are distributed in a closed loop path for each string of data which is input at the input 16 between successive reset pulses at terminal 18. The closed loop of memory locations are distributed between the two memory blocks 14 and 15. The manner of determining the memory locations used will be described below and is controlled by the control unit 13. However, the selection of memory locations involves first addressing a plurality of successive memory locations in one row of memory block 14 followed by a plurality of memory locations in the same row of memory block 15. If the string of data requires more memory locations than are provided by one row in each of blocks 14 and 15, the pattern of memory locations addressed reverts to block 14 after block 15, using a new row in block 14, and continues to switch alternately between block 14 and block 15, having at all times used a plurality (in this example at least four) memory locations in each row of each of the blocks 14 and 15. While data transfers are effected on the minimum of four successive memory locations in either memory block, the entire memory array in the other block may be equated and read. This means that there are at least four successive cycles to transfer data from the four successive memory locations which are used in one memory block for data transfers and during those four cycles the equate and read functions may be carried out on all bit lines in the other memory block.

Figure 5:
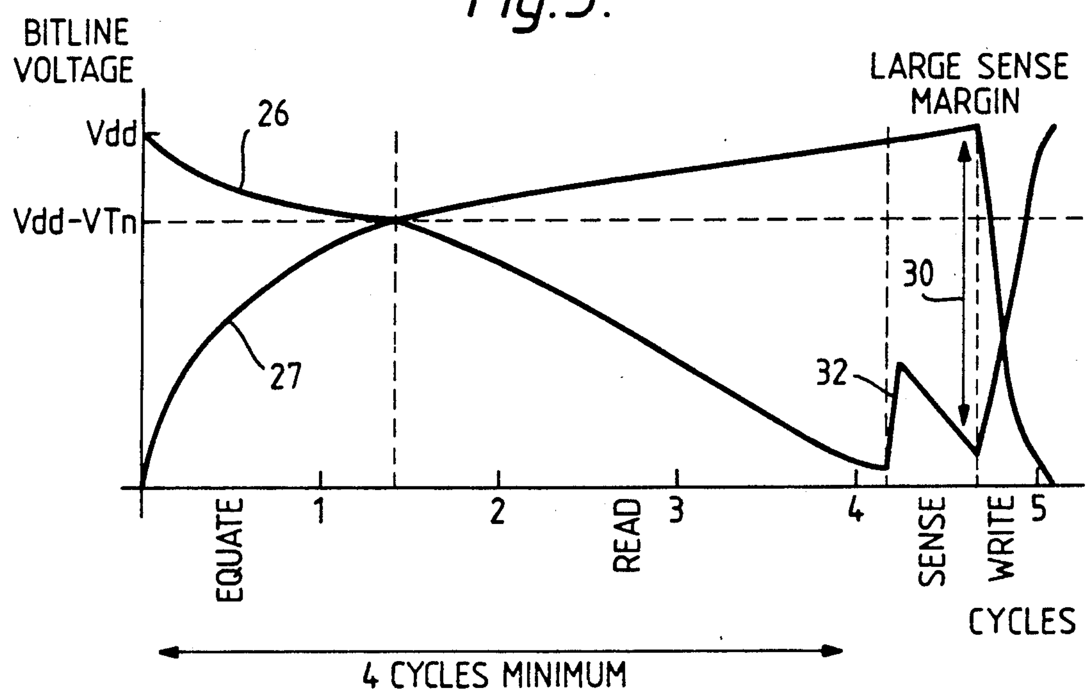
FIG. 5 is a voltage time graph showing operation of the present invention.

The effect of this can be understood with reference to FIG. 5. This graph is equivalent to that of FIG. 6 but showing the voltages on the bit line pair 26 and 27 when used in accordance with the present embodiment. The curves representing the voltages on the bit lines in FIG. 5 have the same reference numerals 26 and 27 as the bit lines they refer to. The period during which the bit lines are precharged so as to equate the voltage signals on both bit lines may now extend over more than one cycle, and the read operation which occurs once a word line 25 has been selected may now extend over more than two cycles to permit the voltage on a bit line pair 26 and 27 to be driven apart over a much longer period thereby resulting in a much greater signal difference between the two bit lines 26 and 27 by the time it is necessary to carry out a sense operation. The substantial change in voltage difference between the bit lines is indicated by the large voltage difference 30 marked in FIG. 5 compared with the small voltage difference 31 marked in FIG. 6. At the end of the read operation when the signal from the memory cell has been transfered to the bit line pair, bit line multiplexing circuitry connects the selected bit lines to a sense amplifier and the capacitance of the multiplexing circuitry causes the reduction in voltage difference indicated at 32 in FIG. 5. However, the voltage sense margin has obtained the level indicated at 30 in FIG. 5 by the end of the sense operation. Thereafter the write operation occurs so that the sense and write operations occur within one cycle. It will however be understood that the sense and write operation is carried out once in each cycle and repeated for several cycles during data transfers in one memory block while the more prolonged equate operation (which term in this specification is used to cover both the equate and read functions) is carried out on the entire other memory block.

It will be understood that in order to carry out repeated cyclic patterns for data strings which are fed through the line delay, it is preferable to avoid unwanted delay between successive data strings and this requires that the addressing of memory locations for each data string occurs in closed loops which allow a new loop to commence immediately after termination of the previous loop. This therefore requires that any cycle of memory addressing starts in block 14 and ends in block 15 ready to start a new cycle in block 14. It is also necessary that the memory locations are distributed between the two blocks so that at least half the locations in any one row which is addressed are used. This maximizes the number of cycles which are available for the equate operation. In the present case it requires that at least four memory locations are used in any addressed row of either of the memory blocks 14 and 15.

In the example shown in FIG. 1 each memory block 14 and 15 has sixty four columns 35, each column being coupled to equate and precharge circuitry 36. The columns are arranged in groups, each group having eight pairs of bit lines so that when any column is addressed eight pairs of bit lines (one in each group) are simultaneously accessed, permitting transfer of eight bits or one word at a time. The bit lines are each connected to column multiplexing circuitry 37 for each column and coupled to sense amplifier and write circuitry 38 for each column. Each sense amplifier and write circuit is connected through a bus driver circuit 39 to the data output 17. Each memory block 14 and 15 has 70 rows each having a word line 25. The word lines are connected to a row decoder 40. The row decoder is coupled to memory block 14 through a latch and word line driver 41 and to the memory block 15 through a latch and word line driver 42. The column multiplex circuitry 37 is controlled by a column counter 44. The row decoder 40 is controlled by a row counter 45. The latch and word line drivers 41 and 42 are controlled by pulse generators 46 and 47 respectively. Each of the drivers 41 and 42 is connected by two separate control lines 48 to the respective one of the pulse generators 46 and 47 so that each driver can be operated either to latch the output of the row decoder 40 or to drive all the word lines low. The selection of memory locations forming each cyclic pattern of addressing is controlled by the control unit 13. The row counter 45 and column counter 44 are connected so that unless instructed by the control 13 to do otherwise they count through successive addresses along each row and then row by row.

The control 13 is arranged to count clock cycles between successive reset pulses input at terminal 18 and to count the number of memory locations remaining in each cyclic pattern of memory addressing. As the number of memory locations remaining in each cycle reduces, the controller 13 determines whether or not all memory locations in each row of the memory block being addressed should be filled or not. By leaving certain memory addresses unused it is possible to arrange that the last address is in memory block 15 and at least four columns have been used in any row addressed in either array 0 or array 1. The control 13 always starts a row in a memory block in column 0 but after using column 3 (at least four columns must be used) it may decide to skip the remainder of that row in that memory block and proceed to the next memory block. Table 1 set out below indicates the memory locations to be used for a variety of delay lengths varying between 17 cycles and 32 cycles. The present example is not intended for use of very short delays which are 16 or less cycles.

TABLE 1

| Delay Length | Array 0 | | | | | | | | Array 1 | | | | | | | |
|---|---|---|---|---|---|---|---|---|---|---|---|---|---|---|---|---|
| 17 | 17 | 16 | 15 | 14 | * | * | * | * | 13 | 12 | 11 | 10 | * | * | * | * |
| | 9 | 8 | 7 | 6 | * | * | * | * | 5 | 4 | 3 | 2 | 1 | * | * | * |
| 18 | 18 | 17 | 16 | 15 | 14 | * | * | * | 13 | 12 | 11 | 10 | * | * | * | * |
| | 9 | 8 | 7 | 6 | * | * | * | * | 5 | 4 | 3 | 2 | 1 | * | * | * |
| 19 | 19 | 18 | 17 | 16 | 15 | 14 | * | * | 13 | 12 | 11 | 10 | * | * | * | * |
| | 9 | 8 | 7 | 6 | * | * | * | * | 5 | 4 | 3 | 2 | 1 | * | * | * |
| 20 | 20 | 19 | 18 | 17 | 16 | 15 | 14 | * | 13 | 12 | 11 | 10 | * | * | * | * |
| | 9 | 8 | 7 | 6 | * | * | * | * | 5 | 4 | 3 | 2 | 1 | * | * | * |
| 21 | 21 | 20 | 19 | 18 | 17 | 16 | 15 | 14 | 13 | 12 | 11 | 10 | * | * | * | * |
| | 9 | 8 | 7 | 6 | * | * | * | * | 5 | 4 | 3 | 2 | 1 | * | * | * |
| 22 | 22 | 21 | 20 | 19 | 18 | 17 | 16 | 15 | 14 | 13 | 12 | 11 | 10 | * | * | * |
| | 9 | 8 | 7 | 6 | * | * | * | * | 5 | 4 | 3 | 2 | 1 | * | * | * |
| 23 | 23 | 22 | 21 | 20 | 19 | 18 | 17 | 16 | 15 | 14 | 13 | 12 | 11 | 10 | * | * |
| | 9 | 8 | 7 | 6 | * | * | * | * | 5 | 4 | 3 | 2 | 1 | * | * | * |
| 24 | 24 | 23 | 22 | 21 | 20 | 19 | 18 | 17 | 16 | 15 | 14 | 13 | 12 | 11 | 10 | * |
| | 9 | 8 | 7 | 6 | * | * | * | * | 5 | 4 | 3 | 2 | 1 | * | * | * |
| 25 | 25 | 24 | 23 | 22 | 21 | 20 | 19 | 18 | 17 | 16 | 15 | 14 | 13 | 12 | 11 | 10 |
| | 9 | 8 | 7 | 6 | * | * | * | * | 5 | 4 | 3 | 2 | 1 | * | * | * |
| 26 | 26 | 25 | 24 | 23 | 22 | 21 | 20 | 19 | 18 | 17 | 16 | 15 | 14 | 13 | 12 | 11 |
| | 10 | 9 | 8 | 7 | 6 | * | * | * | 5 | 4 | 3 | 2 | 1 | * | * | * |

TABLE 1-continued

| Delay | Array | | | | | | | | | | | | | | | |
|---|---|---|---|---|---|---|---|---|---|---|---|---|---|---|---|---|
| Length | 0 | | | | | | | | 1 | | | | | | | |
| 27 | 27 | 26 | 25 | 24 | 23 | 22 | 21 | 20 | 19 | 18 | 17 | 16 | 15 | 14 | 13 | 12 |
| | 11 | 10 | 9 | 8 | 7 | 6 | * | * | 5 | 4 | 3 | 2 | 1 | * | * | * |
| 28 | 28 | 27 | 26 | 25 | 24 | 23 | 22 | 21 | 20 | 19 | 18 | 17 | 16 | 15 | 14 | 13 |
| | 12 | 11 | 10 | 9 | 8 | 7 | 6 | * | 5 | 4 | 3 | 2 | 1 | * | * | * |
| 29 | 29 | 28 | 27 | 26 | 25 | 24 | 23 | 22 | 21 | 20 | 19 | 18 | 17 | 16 | 15 | 14 |
| | 13 | 12 | 11 | 10 | 9 | 8 | 7 | 6 | 5 | 4 | 3 | 2 | 1 | * | * | * |
| 30 | 30 | 29 | 28 | 27 | 26 | 25 | 24 | 23 | 22 | 21 | 20 | 19 | 18 | 17 | 16 | 15 |
| | 14 | 13 | 12 | 11 | 10 | 9 | 8 | 7 | 6 | 5 | 4 | 3 | 2 | 1 | * | * |
| 31 | 31 | 30 | 29 | 28 | 27 | 26 | 25 | 24 | 23 | 22 | 21 | 20 | 19 | 18 | 17 | 16 |
| | 15 | 14 | 13 | 12 | 11 | 10 | 9 | 8 | 7 | 6 | 5 | 4 | 3 | 2 | 1 | * |
| 32 | 32 | 31 | 30 | 29 | 28 | 27 | 26 | 25 | 24 | 23 | 22 | 21 | 20 | 19 | 18 | 17 |
| | 16 | 15 | 14 | 13 | 12 | 11 | 10 | 9 | 8 | 7 | 6 | 5 | 4 | 3 | 2 | 1 |

It can be seen from this Table that the controller 13 must arrange to swap from array 0 to array 1 in any of the following five conditions:

1. 13 samples remain when in array 0 and there are at least 4 samples in the current row of the current half-array. Each sample referred to is a data item in the line of data.

2. 9 samples remain when in array 1 and there are at least 4 samples in the current row of the current half array.

3. 5 samples remain when in array 0 and there are at least 4 samples in the current row of the current half-array.

4. There are 0 samples left.

5. There are 8 samples in the current row of the current array.

Figure 2:
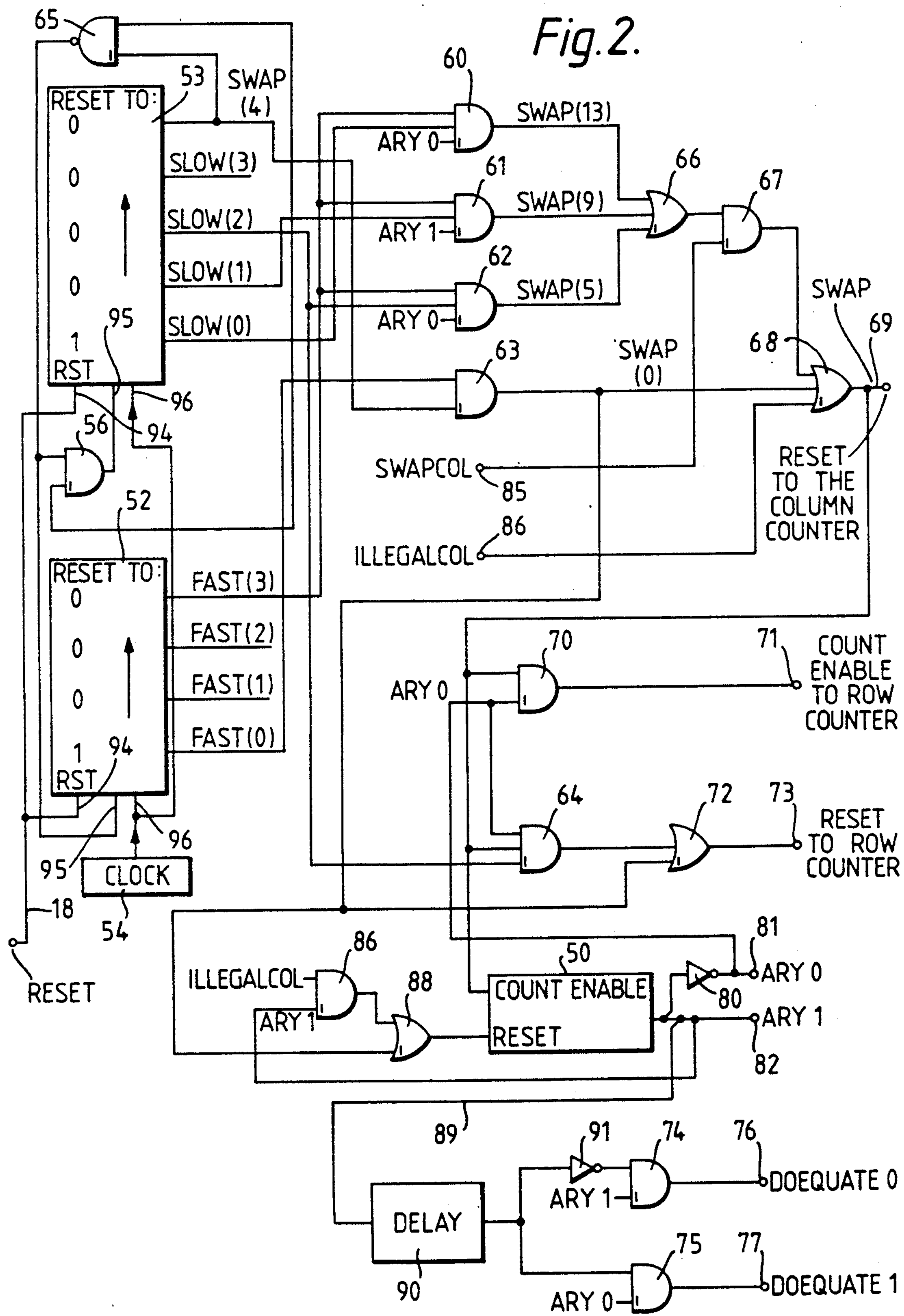
FIG. 2 is a block diagram of a control circuit used in FIG. 1.

Whenever one of these five conditions is met an array counter 50 (which may be in the form of a flip-flop) shown in FIG. 2 changes state to switch from one memory block to the other and the column counter 44 is reset to 0.

The row address that is being used by an active array is stored in the latch 41 or 42 and the address on the output 51 of the row counter 45 is the address of the next row that will be used. The row address is incremented whenever a swap array condition is met and array 0 is currently being used. The row counter 45 is reset when a swap array condition is met when array 0 is being used and there are 5, 6, 7 or 8 samples left as can be seen from Table 1. In these conditions the row counter must be reset as the end of the cyclic pattern is met without advancing to a further row.

In order to meet the conditions required by Table 1, the control circuit 13 is formed as shown in FIG. 2. This circuit includes a shift register 52 connected as a fast ring counter and a further shift register 53 connected as a slow ring counter. Each of the counters 52 and 53 has a reset input 94 connected to receive a reset pulse from terminal 18 as well as a shift enable input 95 and a clock pulse input 96 connected to a timing clock 54. The clock 54 also supplies clock pulses to the column counter 44 and row counter 45. Shift register 52 provides four outputs, fast 0, fast 1, fast 2, and fast 3 and shift register 53 provides five outputs, slow 0, slow 1, slow 2, slow 3 and slow 4. On receipt of a reset pulse at input 94, each of the shift registers is reset so that for shift register 52 fast 0 provides a high output while the other outputs are all low. Shift register 53 is reset so that slow 0 provides a high output while the other outputs are low. Each of the shift registers 52 and 53 is arranged to change state and thereby effect a count only on receipt of each clock pulse at a time when a high input is provided on the shift enable input 95. Each of the shift registers 52 and 53 is arranged so that only one output on each register can provide a high output at any time so that as the count indicated by each register advances a new output from that register goes high while the other outputs are low.

Shift register 52 counts cyclically so that the next shift after a fast 3 output is a return to a fast 0 output. Only when a fast 3 output occurs is a signal fed from AND gate 56 to provide a shift enable input 95 to the shift register 53.

The number of clock pulses occurring after each reset pulse at terminal 18 up to and including the next reset pulse indicates the length of the line delay and thereby indicates the number of data items in the line of data. The data items are written into successive memory addresses in a cycle of addresses counted down to address 0 for the data item which is considered as the last item in the data line. Data items are continuously cycled around the selected memory locations, and address 0 is the location addressed 16 clock cycles after each reset pulse at terminal 18. In this way, data items are read from and written to successive memory locations going column by column and row by row until a reset pulse 18 is supplied to the reset inputs of each of the shift registers 52 and 53. This resets each of the shift registers 52 and 53 and causes a shift enable input to be supplied to the inputs 95, thereby allowing each of the shift registers 52 and 53 to advance at each clock pulse, thereby varying the outputs of each of the shift registers over the next 19 clock cycles. Table 2 below shows the slow and fast outputs of the two shift registers 52 and 53 during the 16 clock cycles following each reset pulse at terminal 18. The Table indicates the number of memory locations to be addressed before reaching address 0 and it will therefore be understood that at the bottom of the Table the last entry indicating 16 locations remaining before reaching address 0 is the situation caused by input of a reset pulse at the inputs 94 causing the two outputs slow 0 and fast 0. The outputs then progress as shown on moving upwards through the Table for each successive clock pulse until address 0 is reached when no more locations remain: at this time the outputs are slow 4 and fast 0.

TABLE 2

| No of Locations | Slow | Fast |
|---|---|---|
| 0 | 4 | 0 |
| 1 | 3 | 3 |
| 2 | 3 | 2 |
| 3 | 3 | 1 |
| 4 | 3 | 0 |
| 5 | 2 | 3 |
| 6 | 2 | 2 |
| 7 | 2 | 1 |
| 8 | 2 | 0 |

TABLE 2-continued

| No of Locations | Slow | Fast |
|---|---|---|
| 9 | 1 | 3 |
| 10 | 1 | 2 |
| 11 | 1 | 1 |
| 12 | 1 | 0 |
| 13 | 0 | 3 |
| 14 | 0 | 2 |
| 15 | 0 | 1 |
| 16 | 0 | 0 |

As is shown in FIG. 2, the shift enable input 95 for shift register 53 is derived from AND gate 56 which has an input from fast 3 output of shift register 52. In this way, the slow shift register 53 can shift only when there is a clock pulse and an output from fast 3 of shift register 52. Furthermore, the AND gate 56 as well as the shift enable input 95 of shift register 52 obtain an output from NAND gate 65 which has inputs from slow 4 and fast 3. Consequently a high shift enable input 95 is provided to the shift register 52 at all times until there are simultaneous outputs fast 3 and slow 4 which are reached three clock pulses after address 0 has been reached. At that point both shift registers 52 and 53 are prevented from any further counting until the next reset pulse 18 is fed to the reset inputs 94 to reset both the shift registers. Consequently after reaching address 0 the column and row counters cycle sequentially along each row for the two memory blocks in turn (starting at column zero of row 0 in array 0) using all memory locations in each row and then moving to the next row and repeating the operation. This can be seen from Table 1 where a delay length of 32 units causes complete use of all memory locations in two successive rows of each of the memory blocks. For delay line length longer than 32 additional complete rows of memory locations will be used.

The outputs of the shift registers 52 and 53 are connected to a plurality of AND gates 60, 61, 62, 63, 64 and 65 as shown.

The output of AND gates 60, 61 and 62 are fed to an OR gate 66 which forms one input to a further AND gate 67. The output of the AND gate 67 is connected to an OR gate 68 leading to an output 69 to reset the column counter. An AND gate 70 provides an output 71 to enable counting by the row counter 45. An OR gate 72 provides an output 73 to reset the row counter 45. Two AND gates 74 and 75 provide respective outputs 76 and 77 representing equate array 0 and equate array 1 respectively. These outputs are supplied to the pulse generators 46 and 47. The outputs 76 and 77 are commands to the pulse generators 46 and 47 to start an equate operation. Thereafter the pulse generators 46 and 47 control the timing of the pulses supplied to the equate and precharge circuitry 36 and the latches and drivers 41 and 42. The array counter 50 has an output connected through an inverter 80 to provide a signal 81 indicating that array 0 is being used for data transfer and a further non-inverted output 82 to indicate that array 1 is being used for data transfer.

AND gate 60 has inputs from fast 3, slow 0 and terminal 81 to indicate when a swap array condition exists with 13 samples left. AND gate 61 has inputs from fast 3, slow 1 and terminal 82 indicating a swap array condition with 9 samples left while in array 1. AND gate 62 has inputs from fast 3, slow 2 and terminal 81 indicating a swap array condition with 5 samples remaining while in array 0. AND gate 63 has inputs from slow 4 and fast 3 indicating that there are 0 samples left and so a swap array condition exists. The OR gate 68 permits a reset signal at output 69 when either there is an output from gate 63 or an output from gate 67. Gate 67 will provide an output whenever there is an input at terminal 85 from the column counter to indicate that at least four columns have been used and at the same time there is an output from the OR gate 66. The OR gate 68 will also permit an output from terminal 69 if the column counter provides a signal at terminal 86 to indicate that all eight columns of that row have already been used. If a swap signal is provided on terminal 69 this is also fed to AND gate 70 which will also enable the row counter to advance through a signal at terminal 71 if the signal at terminal 81 indicates that array 0 is active. The swap signal from terminal 69 is also fed to the array counter 50 to alter the signals on terminals 81 and 82.

The AND gate 64 is arranged to receive inputs from terminal 81 to indicate that array 0 is active as well as inputs from the terminal 69 and from slow 2 of counter 53. As can be seen from Table 2, a slow 2 output indicates that there are either 5, 6, 7 or 8 locations remaining and so the row counter becomes reset at a swap condition when in array 0 and there are 5, 6, 7 or 8 samples remaining. The array counter 50 can also be reset by an output from OR gate 88 indicating that there are no locations remaining or that all columns have been used when array 1 is active.

Whenever the control causes a swap from one array to the other an output from the array counter 50 is fed on line 89 to a one cycle delay unit 90. The output is fed through an inverter 91 to AND gate 94 which forms a DO EQUATE array 0 signal at terminal 76 when the array counter has switched to indicate that array 1 is active. Similarly AND gate 75 receives an input when array 0 is active together with the output from the delay unit 90 so that terminal 77 provides a DO EQUATE array 1 signal at terminal 77 when the array counter 50 switches to array 0.

It will therefore be seen that use of the gating circuitry shown in FIG. 2 causes output signals to the row counter 45 and column counter 44 to address the cycle of memory locations to achieve use of memory locations as shown in Table 1.

The do equate signals 76 and 77 are supplied to the pulse generators 46 and 47 as shown in FIG. 1 and the respective pulse generator operates the word line driver of the memory block which is to be equated to drive the word lines low and thereby disconnect the memory cells from the bit lines prior to equating. The signals on lines 76 and 77 also actuate the pulse generators 46 and 47 to cause a signal to be supplied to the equate and precharge circuitry 36 on the array which is to be equated so that the equate operation is effected one cycle after the word lines of that array have been driven low.

It will be appreciated that by use of the latches 41 and 42, the row decoder 40 may hold an address which is latched for both memory blocks 14 and 15 but when data transfers have been effected by selective addressing within array 0 the swap array condition will enable the row decoder 40 to advance to the next required row address array 0 while latches 42 hold the existing row address for the addressing which will now occur in array 1 in the same row as just used for addressing in array 0.

It will be understood that the column counter outputs a signal on line 93 to the column multiplex circuitry 37 so that when selected memory locations are addressed in each half array, a single address pointer is provided for both data which is written into the memory location and that which is output at the same cycle. Each location which is addressed has data written into that location and the next time that location is addressed, the earlier data is read and sensed thereby providing a delayed data output at the output terminal 17 and new data is written into that location during the same single cycle.

Figure 4:
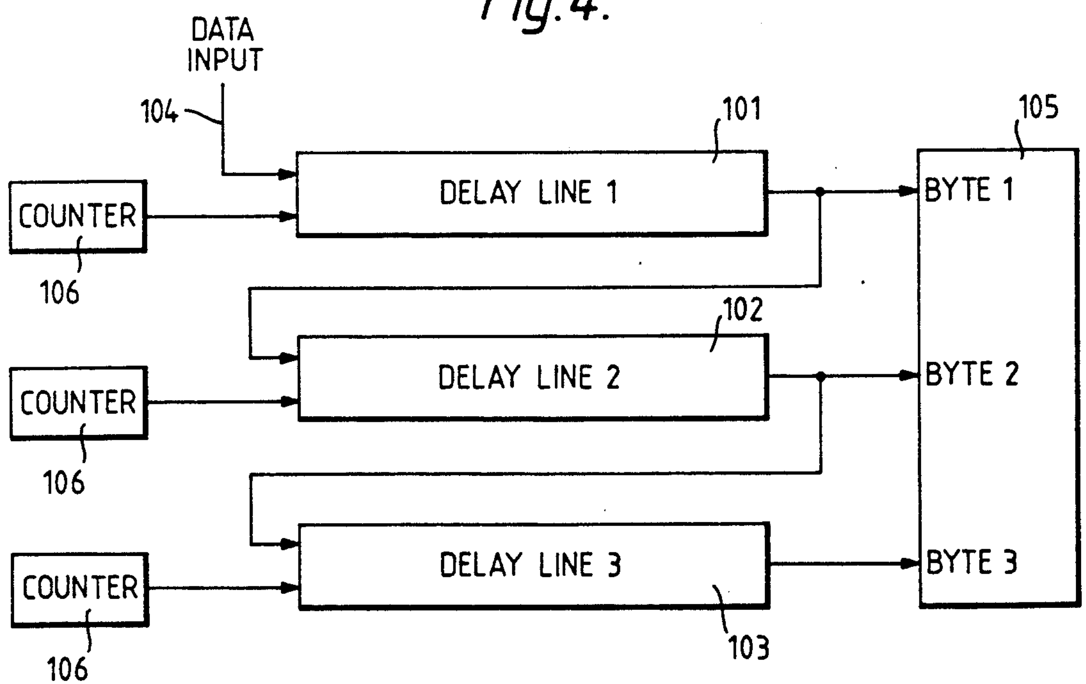
FIG. 4 is a schematic view of a two-dimensional filter using three line delay circuits of the type shown in FIG. 1.

The invention is particularly applicable to the formation of line delays for use in two-dimensional image filters. Such an arrangement is shown in FIG. 4 in which three similar line delays 101, 102 and 103 are connected serially. Data is input at an input 104. The output of the first line delay 101 is fed directly to a sampling device 105 and at the same time forms an input to the second line delay 102. The output of line delay 102 is similarly fed to the sampling device 105 and forms an input to the third line delay 103. The output of the line delay 103 is fed to the sampling device 105. Each line delay outputs one word per cycle and consequently the sampling device may analyse three words simultaneously from the three connected line delays. Each line delay in this example has its own counter 106 to permit programming of the required delay.

The invention is not limited to the details of the foregoing example.

We claim:

1. A method of accessing a memory having a plurality of memory locations comprising static RAM cells, which method comprises the steps of:

distributing said cells in at least first and second memory blocks, each block having a plurality of rows and columns, each cell being connected to a pair of bit lines to transfer data to and from each cell;

addressing sequentially more than one memory location in said first memory block and effecting a data transfer for each memory location addressed, and at the same time effecting an equate operation on bit lines in said second memory block; and after addressing memory locations in said first memory block, switching said addressing and equate operations so as to address sequentially more than one memory location in said second memory block and effecting a data transfer for each memory location addressed and at the same time equating bit lines in said first memory block.

2. A method according to claim 1 in which each data transfer comprises a data sense operation to read data from the bit lines.

3. A method according to claim 2 in which each data transfer also comprises a write operation to write data into a memory location.

4. A method according to claim 1 in which data is transferred from a memory location to a pair of bit lines by a read operation after the lines have been equated and subsequently effecting a sense operation to sense the signal on said pair of bit lines.

5. A method according to claim 4 in which said sense operation forms part of said data transfer and said read operation is effected on selected memory locations during said equate operation in one memory block after the bit lines have been equated and while data transfers are effected in another memory block.

6. A method according to claim 1 in which said equate operation includes precharging said bit lines to a required voltage.

7. A method according to claim 1 in which said addressing and equating is time controlled by a clock, each addressing operation and data transfer being effected in one clock cycle and said equating operation having a duration of more than one clock cycle.

8. A method according to claim 1 in which each said addressing operation comprises addressing a plurality of adjacent memory locations in the same row of one memory block.

9. A method according to claim 8 in which one row is addressed in each of said memory blocks, data transfers are effected in selected locations in said row of each memory block in turn while the other is equated, and the row address is changed to select a further row after said one row has been used in each memory block.

10. A method according to claim 1 in which equating bit lines in a memory block comprises equating all bit lines in that memory block.

11. A method according to claim 1 comprising determining a number of data transfers to be effected at a plurality of accessed locations in a memory accessing cycle, sequentially addressing selected memory locations in each of said memory blocks to distribute said accessed locations through each of said memory blocks, said addressing comprising selecting one memory block to start said cycle, addressing a plurality of locations in one row of said block, switching from said one block to another block and addressing a plurality of locations in a row of said another block, said switching from one block to another being effected without addressing all locations in each row addressed in order to end each said cycle in a memory block other than said selected one in which the cycle started and such that any row addressed in either block has a plurality of addressed locations.

12. A method according to claim 11 in which said switching from one block to another is controlled so that any row used in each block has at least half the locations in that row addressed during said memory accessing cycle.

13. A method according to claim 1 wherein said memory locations are distributed between said first and second blocks of memory, each said block having the same number of columns.

14. A method of cyclically accessing a plurality of memory locations in at least two memory blocks each having said memory locations arranged in rows and columns, which method comprises determining a number of memory locations to be addressed in one memory accessing cycle, sequentially addressing selected memory locations in each of said memory blocks to distribute said accessed locations through each of said memory blocks, said addressing comprising selecting one memory block to start said cycle, addressing a plurality of locations in one row of said block, switching from said one block to another block and addressing a plurality of locations in a row of said another block, said switching from one block to another being effected without addressing all row locations in each row addressed in order to end said cycle in a memory block other than said selected one in which the cycle started and such that any row used in any memory block has a plurality of addressed locations.

15. A method according to claim 14 in which switching from one block to another is controlled so that any row used in each block has at least half the locations in that row addressed during said memory accessing cycle.

16. A method according to claim 14 wherein on switching from addressing one row in said one memory block in which the cycle is started, the same row is addressed in another memory block.

17. A method according to claim 16 wherein each memory accessing cycle comprises addressing more than one row in each memory block, at least one row in each memory block being accessed at all memory locations and one row in each memory block being addressed at less than all memory locations in the row.

18. A method according to claim 14 wherein data is read from and written into each memory location each time the memory location is accessed.

19. A method according to claim 14 wherein said memory locations comprise static RAM cells each connected to a pair of bit lines for use in data transfers to and from the cells, said method further comprising equating bit lines in one memory block while data transfers are effected on a succession of selected memory locations in another memory block.

20. A memory comprising a first memory block, a second memory block, each block having a plurality of rows and columns of memory locations comprising static RAM cells each arranged to hold digital data, a plurality of pairs of bit lines coupled to cells of respective columns for transferring data into and from said cells, column addressing means for addressing said columns, row addressing means for addressing said rows, equating means coupled to said bit lines for equating each pair of bit lines before using each pair of bit lines for transferring data out of a said cell, and control means coupled to said column and row addressing means to address in succession a plurality of memory locations in one of said memory blocks followed by a plurality of memory locations in the other of said memory blocks and to transfer data from said memory locations, said control means being further coupled to said equating means to equate bit lines of each block successively, one block being equated when data is transferred from the other of said blocks.

21. A memory according to claim 20 wherein said column addressing means and said equating means are coupled to bit lines in both said first and second memory blocks, said control means including switching means to switch both said column addressing means and said equating means between different memory blocks alternately.

22. A memory according to claim 20 in which said control means includes address generating means for generating successively a plurality of addresses of adjacent memory locations within the same row of the same memory block and switching means to switch from one memory block to another after addressing a plurality of locations within one memory block.

23. A memory according to claim 20 in which the equating means is coupled to all bit lines of a memory block to equate all bit lines of that memory block at the same time.

24. A memory according to claim 20 in which said row addressing means is coupled to a plurality of word lines for respective rows and further includes latch means to latch a selected row address for one memory block while a new row address is selected for another memory block.

25. A memory according to claim 20 in which writing means is provided to write data into each memory location after each transfer of data, said writing means being coupled to said control means so that data is transferred from and written into each address memory location at each addressing operation.

26. A memory according to claim 20 further including clock means to indicate clock cycles, said addressing means being responsive to said clock means to address a different memory location each clock cycle whereby said equating of bit lines in one memory block is effected over a plurality of clock cycles while data is transferred from a succession of locations in another memory block at each of said plurality of clock cycles.

27. A line delay device for use in delaying digital signals by a predetermined number of cycles, said device comprising a memory as claimed in claim 20 together with counter means for indicating a number of cycles of delay, and means for cyclically accessing a plurality of locations in said memory dependent on said number of cycles of delay, means being provided to read data from each location and write new data into each location each time the location is accessed.

28. A plurality of line delay devices each according to claim 27, said delay devices being connected serially with the output of one device connected to the input of an adjacent device.

* * * * *